(12) United States Patent
Velic et al.

(10) Patent No.: US 12,257,908 B2
(45) Date of Patent: Mar. 25, 2025

(54) DRIVE UNIT FOR AN ELECTRIC VEHICLE, PULSE INVERTER MODULE, SYSTEM AND VEHICLE

(71) Applicant: Dr. Ing. h.c. F. Porsche Aktiengesellschaft, Stuttgart (DE)

(72) Inventors: Timijan Velic, Weissach (DE); Patrick Fuchs, Leonberg (DE); Maximilian Barkow, Stuttgart (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 295 days.

(21) Appl. No.: 17/874,339

(22) Filed: Jul. 27, 2022

(65) Prior Publication Data

US 2023/0030764 A1 Feb. 2, 2023

(30) Foreign Application Priority Data

Jul. 29, 2021 (DE) ...................... 10 2021 119 697.3

(51) Int. Cl.
| | |
|---|---|
| *B60L 50/51* | (2019.01) |
| *H02K 7/116* | (2006.01) |
| *H02M 7/00* | (2006.01) |
| *H02P 27/08* | (2006.01) |
| *H05K 7/20* | (2006.01) |

(52) U.S. Cl.
CPC .............. *B60L 50/51* (2019.02); *H02K 7/116* (2013.01); *H02M 7/003* (2013.01); *H02P 27/08* (2013.01); *H05K 7/20927* (2013.01); *B60L 2210/40* (2013.01)

(58) Field of Classification Search
CPC ..... B60L 50/51; B60L 2210/40; H02K 7/116; H02K 5/04; H02K 11/33; H02M 7/003; H02P 27/08; H05K 7/20927; Y02T 10/64
See application file for complete search history.

(56) References Cited

U.S. PATENT DOCUMENTS

| | | | |
|---|---|---|---|
| 10,259,310 | B2 | 4/2019 | Agata et al. |
| 2012/0313465 | A1 | 12/2012 | Prix |
| 2013/0193883 | A1 | 8/2013 | Shitabou |
| 2017/0334516 | A1* | 11/2017 | Ferguson ................. A61G 5/04 |

FOREIGN PATENT DOCUMENTS

| | | |
|---|---|---|
| DE | 112015004417 T5 | 7/2017 |
| DE | 102016123220 A1 | 6/2018 |
| DE | 102018000803 A1 | 8/2018 |

* cited by examiner

*Primary Examiner* — Yuen Wong
(74) *Attorney, Agent, or Firm* — LEYDIG, VOIT & MAYER, LTD.

(57) ABSTRACT

A drive unit for an electric vehicle, including an electric machine, a gear mechanism, a housing, wherein the electric machine and the gear mechanism are arranged in an interior of the housing, and a receiving apparatus for a pulse inverter module, wherein the housing has an opening and the receiving apparatus is arranged in the interior of the housing directly behind the opening.

15 Claims, 1 Drawing Sheet

DRIVE UNIT FOR AN ELECTRIC VEHICLE, PULSE INVERTER MODULE, SYSTEM AND VEHICLE

CROSS REFERENCE TO RELATED APPLICATIONS

This application claims benefit to German Patent Application No. DE 10 2021 119 697.3, filed on Jul. 29, 2021, which is hereby incorporated by reference herein.

FIELD

The invention relates to a drive unit for electric vehicle, having an electric machine, a gear mechanism and a housing.

BACKGROUND

In addition to the electric machine and the gear mechanism connected to the drive shaft, electric drive units for electric vehicles usually have a pulse inverter which converts the direct current provided by the drive battery to a three-phase current for operating the electric machine. The electric machine is in turn the energy converter which converts the electrical energy to mechanical energy and generates the desired rotational speeds and torques through suitable actuation. The movement variables of the rotation generated by the machine can be changed by the gear mechanism and finally transmitted to the driven wheel via the drive shaft.

The basic components of the drive, that is to say electric machine, gear mechanism and inverter, are usually installed in a manner fixedly connected to one another in known embodiments. For example, DE 10 2016 123 220 A1 discloses a drive train unit comprising electric machine, gear mechanism and pulse inverter, DE 10 2018 000 803 A1 discloses a converter motor which comprises an electric machine comprising housing part and fan, a fan cowl and a converter, US 2017/334516 A1 discloses an electric drive wheel hub system comprising electric machine, gear mechanism and converter, and US 2013/0193883 A1 discloses a motor unit comprising an electrical machine and a converter. In particular, the pulse inverter is generally screwed to the electric machine and the housing of the drive unit is closed after assembly. A removal of individual components is therefore only possible when the entire drive unit is unscrewed and opened, with the result that maintenance and repair are accordingly made more difficult.

SUMMARY

In an embodiment, the present disclosure provides a drive unit for an electric vehicle, comprising an electric machine, a gear mechanism, a housing, wherein the electric machine and the gear mechanism are arranged in an interior of the housing, and a receiving apparatus for a pulse inverter module, wherein the housing has an opening and the receiving apparatus is arranged in the interior of the housing directly behind the opening.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
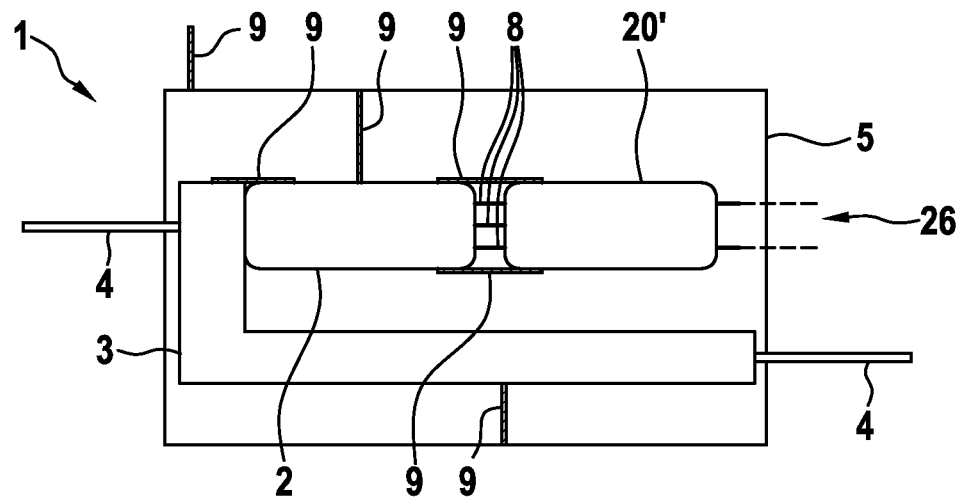
FIG. 1 shows the schematic construction of a drive unit from the prior art.

In an embodiment, the present invention provides a drive unit and a pulse inverter which make flexible maintenance and repair possible.

A drive unit for an electric vehicle is disclosed, having an electric machine, a gear mechanism and a housing, wherein the electric machine and the gear mechanism are arranged in an interior of the housing, wherein the drive unit has a receiving apparatus for a pulse inverter module, wherein the housing has an opening and the receiving apparatus is arranged in the interior of the housing directly behind the opening.

In the drive unit according to an embodiment of the invention, a pulse inverter designed as a module can be inserted into the receiving apparatus provided therefor and removed therefrom through the housing opening. In this way, maintenance, replacement and repair of the pulse inverter are significantly simplified. Furthermore, the modular design enables a series of advantageous embodiments for the pulse inverter using which the handling, the operation, and the replacement and reconstruction possibilities of the pulse inverter can be optimized.

In the drive unit according to an embodiment of the invention, the electric machine and the gear mechanism are in particular fixedly installed in the interior of the housing. The electric machine is connected to the gear mechanism by means of a shaft, with the shaft being used to transmit the torque generated by the electric machine to the gear mechanism. The gear mechanism is able to be connected in particular to a drive shaft or the drive unit has a drive shaft which is connected to the gear mechanism. In particular, the drive unit is an axle drive unit. In order to enable a simple mounting or replacement ability of the pulse inverter module, the housing of the drive unit has an opening through which the pulse inverter module can be inserted, plugged or pushed into the receiving apparatus provided therefor. The receiving apparatus is arranged directly behind the opening of the housing and the pulse inverter module can be moved from the opening to the receiving apparatus in particular on a straight path. The distance between the receiving apparatus and the opening is preferably at most 40 cm, particularly preferably at most 30 cm and very particularly preferably at most 20 cm.

The receiving apparatus is configured to receive the pulse inverter module and for this purpose can have for example a receiving space for receiving the pulse inverter module. The receiving space can be formed by a container which is open (and in particular is able to be closed) toward the opening of the housing. The receiving apparatus can also be formed by a frame or by receiving rails or by one or more guide elements, for example pins which are received by complementarily formed recesses or bores in the pulse inverter module. Conversely, the receiving apparatus can have recesses or bores which receive complementarily formed guide elements of the pulse inverter module. The pulse inverter module can be secured to or in the receiving apparatus in particular using securing means such as screws or bolts, for example. The receiving apparatus and/or the pulse inverter module can to this end have in particular one or more bores with an internal thread. The receiving apparatus and/or the pulse inverter module may also be able to be connected to one another in a latching or lockable manner, with the receiving apparatus in this case having in particular a latching element (or a plurality of latching elements) or a locking element (or a plurality of locking elements). The receiving apparatus is configured in particular to be connected to the pulse inverter module in a releasable manner. The receiving apparatus can also be formed by a support element such as a plate, for example, to which the pulse inverter module can be secured using securing means such as screws, for example.

In particular, the receiving apparatus can have a low-voltage connection element which is configured to supply electrical energy to the low-voltage components of the pulse inverter module. The receiving apparatus preferably has at least one high-voltage connection element which is configured to transmit electrical energy from a DC voltage source to the pulse inverter module. In addition or as an alternative, the receiving apparatus preferably has at least one high-voltage connection element which is configured to transmit electrical energy from the pulse inverter module to the electric machine.

According to an advantageous configuration of the drive unit according to an embodiment of the invention, the housing has a cover for closing the opening, wherein the cover is designed in particular to be removable or to be able to be folded out. The cover can be designed for example as a lid or cap. The lid can be connected to the housing in particular so as to be able to rotate and can expose or close the opening of the housing through rotation.

According to an advantageous configuration of the drive unit according to an embodiment of the invention, the receiving apparatus is arranged on the electric machine and in particular is screwed to the electric machine. In this way, the pulse inverter module can be arranged in the immediate surroundings of the electric machine so that the electrical line between the module and the electric machine can be appropriately short.

According to an advantageous configuration of the drive unit according to an embodiment of the invention, the receiving apparatus has a first contact element for electrical connection to a DC voltage source and/or a second contact element for electrical connection to the electric machine. In other words, the first and/or second contact element form high-voltage connection elements by means of which the pulse inverter module can be connected to the DC voltage source or the electric machine. The DC voltage source is in particular an energy storage unit such as the drive battery of an electric vehicle, for example. For example, the first and/or the second contact element may be plugs or sockets which are able to be connected to complementarily formed contact elements of the pulse inverter module.

A pulse inverter module for an embodiment of the drive unit according to an embodiment of the invention is also provided, with the pulse inverter module being able to be inserted into the receiving apparatus through the opening of the housing. The pulse inverter module in this case functions as a type of "insert sleeve" which is placed between the conductors for the DC voltage source and the conductors for the electric machine and takes on the conversion of the DC voltage to the AC or three-phase voltage required to operate the electric machine. In this case, the pulse inverter module is configured to convert a DC input voltage to an AC output voltage, in particular a three-phase output voltage. The dimensions and the shape of the pulse inverter module and/or the opening are designed in particular in such a way that the pulse inverter module is able to be moved into the interior of the housing through the opening. In particular, the pulse inverter module can be designed in a manner complementary to the receiving apparatus in such a way that the pulse inverter module is received by the receiving apparatus or a receiving space of the receiving apparatus without play. The pulse inverter module can have recesses or bores, for example, which receive one or more guide elements, for example pins, of the receiving apparatus and are designed in particular in a manner complementary to the guide elements. Conversely, the pulse inverter module can have guide elements such as one or more pins, for example, which are received by complementarily formed recesses or bores of the receiving apparatus. The pulse inverter module may be able to be secured to or in the receiving apparatus in particular using securing means such as screws or bolts, for example. The receiving apparatus and/or the pulse inverter module can have one or more bores for this purpose, for example, in particular with an internal thread. The pulse inverter module can also have one or more latching elements or one or more locking elements which are configured for connection to the receiving apparatus. The pulse inverter module is configured in particular to be connected to the receiving apparatus in a releasable manner.

According to an advantageous configuration of the pulse inverter module according to an embodiment of the invention, provision is made for the pulse inverter module to have a plurality of module components and a module base body comprising a plurality of receiving locations, wherein the module components are arranged at the receiving locations, wherein the plurality of module components comprises in particular a power module and/or a microcontroller and/or a link capacitor. Furthermore, the individual components can comprise an EMC (electromagnetic compatibility) filter. The base body of the pulse inverter module in this case forms a structure on which the individual components can be arranged. On this base structure, it is possible to realize an intelligent distribution of the individual module components which optimally utilizes the available installation space and/or enables efficient cooling of the module components. In this case, the individual components can be arranged at the receiving locations in a positive or non-positive manner. The receiving locations may be for example plug locations or sockets or may be recesses or bores in the module base body at which the individual components can be arranged using securing means such as screws. In particular, the individual components are designed to be arranged at the receiving locations in a releasable manner. It is also conceivable that a first portion of the individual components of the pulse inverter module is fixedly embedded in the pulse inverter module or connected thereto in a materially bonded manner (for example adhesively bonded), while a second portion of the individual components is arranged, in particular arranged in a releasable manner, at the receiving locations. The receiving locations and/or the individual components can also have a latching or snap-fit connection by way of which the individual components are arranged at the receiving locations.

For the construction, the shaping and nature of the module base body, the concept of an embodiment of the invention enables a series of advantageous design options which are described below.

According to an advantageous configuration of the pulse inverter module according to an embodiment of the invention, at least one receiving location is arranged on an external surface of the module base body and/or at least one further receiving location is arranged within the module base body. For example, it is also conceivable that receiving locations are arranged on two, three or four side faces of the module base body and/or at least two, three or four receiving locations are arranged within the module base body.

According to an advantageous configuration of the pulse inverter module according to an embodiment of the invention, the module base body has a guide means for a coolant. The coolant is in particular a liquid or gaseous dielectric coolant. For example, one or more channels can be formed in the module base body, with connections for coolant lines being arranged at the outside of the openings of said channels. As an alternative, it is also conceivable that the module base body has through-holes or groove-shaped recesses which are designed to receive coolant lines.

According to an advantageous configuration of the pulse inverter module according to an embodiment of the invention, the module base body is formed from plastic. For example, thermosets or possibly also thermoplastics can be used here as materials. In particular, the module base body can be produced by an injection-molding method. The module base body can also consist of a composite material, such as a fiber-reinforced plastic, for example. It is also conceivable that the module base body is formed only partly from a plastic.

According to an alternative configuration of the pulse inverter module according to an embodiment of the invention, the module base body is formed at least partly from metal. For example, aluminum can be used here as material. It is also possible that the module base body is formed partly from metal and partly from a plastic.

According to an advantageous configuration of the pulse inverter module according to an embodiment of the invention, the pulse inverter module has a third and fourth contact element which are configured to make electrical contact with the first and second contact element of the drive unit. The connection between the first and second contact element of the receiving apparatus and the third and fourth contact element, which are part of the pulse inverter module, can be realized in particular in a releasable manner, for example by a plug connection. In particular, the third contact element is configured to make contact with the first contact element of the receiving apparatus so that a connection is able to be produced between the pulse inverter module and the DC voltage source. In particular, the fourth contact element is furthermore configured to make contact with the second contact element of the receiving apparatus so that a connection is able to be produced between the pulse inverter module and the electric machine. The first and third contact element for this purpose preferably each have two electrical contacts in order to supply the DC voltage of the DC voltage source to the pulse inverter module. The second and third contact element preferably have at least three electrical contacts in order to transmit the three-phase current generated from the DC voltage by the pulse inverter to the electric machine.

The pulse inverter module preferably has an electrical connection for the low-voltage components of the pulse inverter module.

According to an advantageous configuration of the pulse inverter module according to an embodiment of the invention, the pulse inverter module has a busbar system arranged on the module base body, the busbar system being configured to electrically interconnect the module components. The busbar system can in this case have DC busbars and/or AC busbars for carrying power. In this case, the busbar system can advantageously be configured so that a very variable and flexible rail system can be realized, for example to connect the module components within the structure formed by the module base body.

In an embodiment, the invention provides a system composed of an embodiment of the drive unit according to the invention and an embodiment of the pulse inverter module according to the invention. The same design options and advantages that have been described above in relation to the drive unit and the pulse inverter module result for the system according to the invention.

In an embodiment, the invention provides an electric vehicle, having an embodiment of the drive unit according to the invention or an embodiment of the system according to the invention composed of the drive unit and the pulse inverter module. The same design options and advantages that have been described in relation to the drive unit and the pulse inverter module result for the vehicle according to the invention. In particular, the vehicle has an energy storage unit (drive battery), wherein the pulse inverter module is connected to the energy storage unit and is configured to convert the DC voltage of the energy storage unit to an AC output voltage, in particular a three-phase output voltage, for operating the electric machine.

The illustration in FIG. 1 schematically shows a typical construction of the drive units 1 known from the prior art. The main components of the drive unit 1 which are arranged in the housing 5 are the electric machine 2, the gear mechanism 3 connected to the drive shaft 4, and the pulse inverter 20'. The mechanical connection of the components is indicated in the figure by the elements 9. The pulse inverter 20' usually comprises an EMC filter, a power module 23, a link capacitor 25, a controller circuit board 24, AC and DC busbars for carrying power, and a housing. In this arrangement, the pulse inverter 20' takes on the function of converting the direct current provided by the drive battery to a three-phase current for operating the electric machine 2. The electrical connection 26 to the drive battery is only indicated here, while the connection to the electric machine 2 is illustrated by the conductors 8. All of these components 2, 3 and 20' are usually installed in a manner fixedly connected to one another in the drive units 1 known from the prior art. A removal of individual components, such as for example, is therefore only possible when the entire drive unit is unscrewed and opened, with the result that maintenance and repair are accordingly made more difficult.

Figure 2:
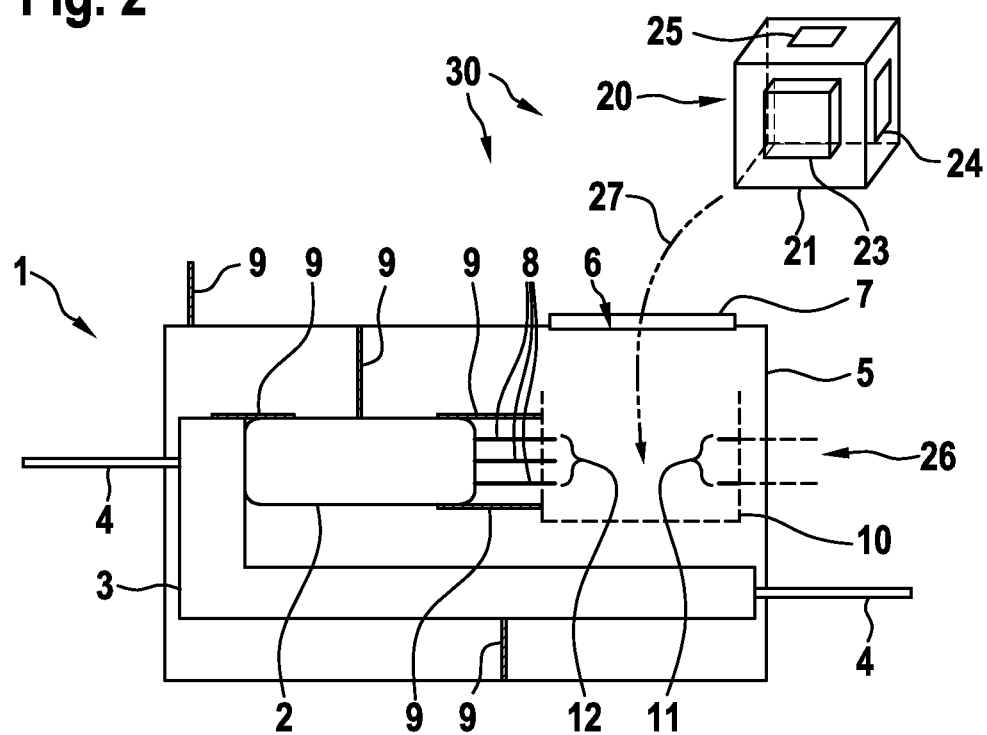
FIG. 2 shows the schematic construction of an embodiment of the system according to the invention composed of a drive unit and pulse inverter module.

The image in FIG. 2 shows the schematic construction of an embodiment of the system 30 according to an embodiment of the invention composed of a drive unit 1 and pulse inverter module 20. The pulse inverter designed as a module 20 is not installed here in a manner fixed to the rest of the components of the drive unit 1 but can be inserted into a receiving apparatus 10 in the interior of the housing 5 (illustrated by the arrow 27) or can be removed therefrom through an opening 6 of the housing 5. The opening 6 of the housing 5 can in this case be closed by a cover 7. The pulse inverter module 20 in this case functions as a type of "insert sleeve" which is placed between the connection 26 for the DC voltage source and the connection 8 for the electric machine 2 and takes on the conversion of the DC voltage to the AC or three-phase voltage required to operate the electric machine 2. For this purpose, the receiving apparatus 10 has a first contact element 11 for electrical connection to the DC voltage source and a second contact element 12 for electrical connection to the electric machine 2.

The pulse inverter module 20 itself has various high-voltage components 23, 25 and low-voltage components 24, such as a power module 23, a link capacitor 25 and a controller circuit board 24, for example. The illustrated arrangement of the individual components 23, 24, 25 of the module 20 is in this case purely exemplary and is to be understood as schematic. The module 20 has a module base body 21 comprising a plurality of receiving locations which form a base structure on which the individual components 23, 24, 25 are arranged. The shape of the base body 21 can be designed relatively freely and the base body 21 can be produced from a variety of possible materials. In particular, the base body 21 can be produced for example cost-effectively from a plastic. On this base structure, it is possible to realize an intelligent distribution of the individual module components 23, 24, 25 which optimally utilizes the available installation space and/or enables efficient cooling of the module components. By way of example, the power module 25 is in this case arranged within the module base body 21, while the controller circuit board 24 and the link capacitor 25 are arranged on an outwardly facing face of the base body 21. The components 23, 24, 25 can in this case all be arranged on or in the base body 21 in a releasable manner or a portion thereof can be fixedly embedded in the pulse inverter module or can be connected thereto in a materially bonded manner.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE DESIGNATIONS

1 Drive unit
2 Electric machine
3 Gear mechanism
4 Drive shaft
5 Housing
6 Opening
7 Cover
8 Three-phase current connection
9 Mechanical connection
10 Receiving apparatus
11 First contact element
12 Second contact element
20 Pulse inverter module
20' Pulse inverter from the prior art
21 Module base body
23 Power module
24 Microcontroller
25 Link capacitor
26 Connection to energy store
27 Insertion movement of the pulse inverter module
30 System composed of drive unit and pulse inverter module

The invention claimed is:

1. A drive unit for an electric vehicle, comprising:
an electric machine;
a gear mechanism;
a housing, wherein the electric machine and the gear mechanism are arranged in an interior of the housing; and
a receiving apparatus for a pulse inverter module, wherein the housing has an opening and the receiving apparatus is arranged in the interior of the housing directly behind the opening.

2. The drive unit as claimed in claim 1, wherein the housing has a cover for closing the opening, wherein the cover is configured to be removable or to be folded out.

3. The drive unit as claimed in claim 1, wherein the receiving apparatus is arranged on the electric machine and is screwed to the electric machine.

4. The drive unit as claimed in claim 1, wherein the receiving apparatus has a first contact element for electrical connection to any one of a DC voltage source or a second contact element for electrical connection to the electric machine.

5. A pulse inverter module for the drive unit as claimed in claim 1, wherein the pulse inverter module is configured to be inserted into the receiving apparatus through the opening of the housing.

6. The pulse inverter module as claimed in claim 5, comprising:
a plurality of module components; and
a module base body comprising a plurality of receiving locations,
wherein the module components are arranged at the plurality of receiving locations, and
wherein the plurality of module components comprise any one of a power module or a microcontroller or a link capacitor.

7. The pulse inverter module as claimed in claim 6, wherein the plurality of module components are arranged at the receiving locations in a releasable manner.

8. The pulse inverter module as claimed in claim 6, wherein the module base body has a guide for a coolant.

9. The pulse inverter module as claimed in claim 6, wherein the module base body is formed from plastic.

10. The pulse inverter module as claimed in claim 6, wherein the module base body is formed at least partly from metal.

11. The pulse inverter module as claimed in claim 6, wherein the pulse inverter module has a busbar system arranged on the module base body, the busbar system being configured to electrically interconnect the plurality of module components.

12. The pulse inverter module as claimed in claim 5, wherein at least one receiving location is arranged on any one of an external face of the module base body or at least one further receiving location is arranged within the module base body.

13. The pulse inverter module as claimed in claim 5, wherein the pulse inverter module has a third and fourth contact element which are configured to make electrical contact with the first and second contact element of the drive unit.

14. A system comprising:
- a drive unit comprising:
- an electric machine;
- a gear mechanism;
- a housing, wherein the electric machine and the gear mechanism are arranged in an interior of the housing;
- a receiving apparatus for a pulse inverter module, wherein the housing has an opening and the receiving apparatus is arranged in the interior of the housing directly behind the opening; and
- a pulse inverter module for the drive unit, wherein the pulse inverter module is configured to be inserted into the receiving apparatus through the opening of the housing.

15. An electric vehicle, comprising the system as claimed in claim 14.

* * * * *